US009403675B2

(12) United States Patent  
Ho et al.

(10) Patent No.: US 9,403,675 B2  
(45) Date of Patent: Aug. 2, 2016

(54) SELF-ALIGNED MASKS AND METHODS OF USE

(71) Applicants: Paul S. Ho, Austin, TX (US); Zhuojie Wu, Austin, TX (US)

(72) Inventors: Paul S. Ho, Austin, TX (US); Zhuojie Wu, Austin, TX (US)

(73) Assignee: BOARD OF REGENTS, THE UNIVERSITY OF TEXAS SYSTEM, Austin, TX (US)

(*) Notice: Subject to any disclaimer, the term of this patent is extended or adjusted under 35 U.S.C. 154(b) by 13 days.

(21) Appl. No.: 14/466,059

(22) Filed: Aug. 22, 2014

(65) Prior Publication Data

US 2015/0054135 A1    Feb. 26, 2015

Related U.S. Application Data

(60) Provisional application No. 61/868,883, filed on Aug. 22, 2013.

(51) Int. Cl.
| | |
|---|---|
| *H01L 21/3065* | (2006.01) |
| *H01L 21/308* | (2006.01) |
| *H01L 21/027* | (2006.01) |
| *B81C 1/00* | (2006.01) |
| *H01L 21/033* | (2006.01) |
| *H01L 21/311* | (2006.01) |

(52) U.S. Cl.
CPC ............. *B81C 1/00* (2013.01); *H01L 21/0337* (2013.01); *H01L 21/3086* (2013.01); *H01L 21/31116* (2013.01); *H01L 21/31122* (2013.01)

(58) Field of Classification Search
CPC .. H01L 21/3605; H01L 21/027; H01L 21/308
USPC .......................................... 257/618; 438/712
See application file for complete search history.

(56) References Cited

U.S. PATENT DOCUMENTS

| 5,882,982 | A  | * | 3/1999  | Zheng et al. ............... 438/424 |
| 2003/0227088 | A1 | * | 12/2003 | Tokushige ................ 257/758 |
| 2007/0231980 | A1 | * | 10/2007 | Forbes ...................... 438/157 |
| 2011/0151190 | A1 | * | 6/2011  | Chung et al. ............. 428/143 |

(Continued)

OTHER PUBLICATIONS

P. Normand et al, "A Masking Approach for Anisotropic Silicon Wet Etching", Electrochemical and Solid-State Letters, 4 (10), G73-G76 (2001).*

(Continued)

*Primary Examiner* — Cuong Q Nguyen  
*Assistant Examiner* — Tong-Ho Kim  
(74) *Attorney, Agent, or Firm* — Baker Botts L.L.P.

(57) ABSTRACT

The disclosure relates to a method for forming a nanoscale structure by forming a pattern on a selectively etched layer located on top of a substrate using lithography, wherein the pattern results a gap having sidewalls, performing RIE on the gap having sidewalls, wherein RIE results in the formation of a self-aligned mask on the bottom wall of the gap with unprotected regions on the bottom wall of the gap near the junctions with the sidewalls, and wet etching the gap having a self-aligned mask and unprotected regions to remove the substrate under the unprotected regions to form a nanoscale structure in the substrate. The disclosure also relates to a nanoscale structure array including a plurality of nanotrenches, nanochannels or nanofins having a width of 50 nm or less and an average variation in width of 5% or less along the entire length of each nanotrench, nanochannel or nanofin.

18 Claims, 13 Drawing Sheets

(56) References Cited

U.S. PATENT DOCUMENTS

2012/0202325 A1* 8/2012 van den Berg et al. ....... 438/197
2014/0249039 A1* 9/2014 Cao et al. ..................... 506/4

OTHER PUBLICATIONS

1. G. Oehrlein, and Y. Lee, "Reactive ion etching related Si surface residues and subsurface damage: Their relationship to fundamental etching mechanisms", Journal of Vacuum Science & Technology A: Vacuum, Surfaces, and Films 5, 1585 (1987), 11 pages.
2. P. Normand et al., "A Masking Approach for Anisotropic Silicon Wet Etching", Electrochemical and Solid-State Letters 4, G73 (2001), 4 pages.
D. Kendall, "Vertical Etching of Silicon at Very High Aspect Ratios", Annual Review of Materials Science 9, 373 (1979), 32 pages.
P. Abgrall, and N. T. Nguyen, "Nanofluidic Devices and Their Applications", Analytical Chemistry 80, 2326 (2008), 16 pages.
R.B. Schoch, J. Han, and P. Renaud, "Transport phenomena in nanofluidics", Reviews of Modern Physics 80, 839 (2008), 45 pages.
J. Perry, and S. Kandlikar, "Review of fabrication of nanochannels for single phase liquid flow", Microfluidics and Nanofluidics 2, 185 (2006), 9 pages.
H. Daiguji et al., "Electrochemomechanical Energy Conversion in Nanofluidic Channels", Nano Letters 4, 2315 (2004), 7 pages.
P. Sinha et al., "Nanoengineered device for drug delivery application", Nanotechnology 15, 585 (2004), 6 pages.
F. Martin et al., "Tailoring width of microfabricated nanochannels to solute size can be used to control diffusion kinetics", Journal of Controlled Release 102, 123 (2005), 11 pages.
R. Karnik et al., "Electrostatic Control of Ions and Molecules in Nanofluidic Transistors", Nano Lett 5, 943 (2005), 6 pages.
Q. Xia et al., "Sub-10 nm Self-Enclosed Self-Limited Nanofluidic Channel Arrays", Nano Letters 8, 3830 (2008), 4 pages.
Henri Jansen et al., "The black silicon method: a universal method for determining the parameter setting of a fluorine-based reactive ion etcher in deep silicon trench etching with profile control", J. Micromech. Microeng. 5 (1995) 115-120, Jan. 4, 1995.

* cited by examiner

SELF-ALIGNED MASKS AND METHODS OF USE

PRIORITY CLAIM

This application claims priority under 35 U.S.C. §119 to U.S. Provisional Patent Application Ser. No. 61/868,883 filed Aug. 22, 2013. The contents of which are incorporated by reference herein in their entirety.

TECHNICAL FIELD

The present disclosure relates to self-aligned masks. It also relates to methods of forming self-aligned masks and their use in forming nanoscale structures, such as nanotrenches, nanochannels and nanofins.

BACKGROUND

Patterning nanostructures in a densely packed fashion is crucial to nanotechnology and advanced semiconductor integrated circuits (IC) industry. A lithography step is usually first used to define nanoscale patterns in the resist layer. Then etching is performed to transfer the nanoscale patterns into the functional materials underneath the resist layer. The minimum pattern pitch that can be printed by the state-of-the-art 193 nm immersion optical lithography is about 80 nm. To meet the demand of patterning smaller and denser structures, double patterning techniques such as litho-etch-litho-etch, litho-freeze-litho-etch and sidewall image transfer are introduced in fabrication of advanced ICs. However, each of these techniques requires significant extra process steps or cost. Therefore, it is highly desirable to have a patterning technique not only to overcome the lithography limit in both feature size and density but also to achieve a simplified process flow resulting in significant cost reduction and yield improvement.

On the other hand, nanostructures with reduced dimensions are more sensitive to process variation such as line edge roughness (LER), which is detrimental to the operation of nano-devices. Therefore it is also highly desirable to have a technique to form nanostructures with reduced LER.

SUMMARY

The present disclosure relates to a method for forming a self-aligned mask by forming a pattern on a selectively etchable layer, such as a dielectric film, located on top of a substrate using lithography, wherein the pattern results a gap having sidewalls, performing reactive ion etching (RIE) on the gap having sidewalls, wherein RIE results in the formation of a self-aligned mask on the bottom wall of the gap with unprotected regions on the bottom wall of the gap near the junctions with the sidewalls. The RIE may include any plasma enhanced etching.

The present disclosure further relates a method for forming a nanoscale structure by etching the gap having a self-aligned mask and unprotected regions to partially remove the substrate material under the unprotected regions to form nanoscale structures, such as nanotrenches, nanochannels and nanofins, in the substrate.

The present disclosure also relates to a method for forming silicon-based nanoscale structures by forming a self-aligned mask on a silicon-based substrate and etching the silicon-based substrate with the self-aligned mask on the silicon-based substrate.

The present disclosure also relates to fabrication of silicon-based nanoscale structures with atomically smooth sidewalls by forming a self-aligned mask on a (110) orientated single crystalline silicon-based substrate (as defined using the Miller index) and anisotropic wet etching the silicon-based substrate to expose the smooth (111) sidewalls.

The present disclosure also relates to fabrication of a nanoscale structure array including a plurality of nanotrenches, nanochannels or nanofins each having a width of 100 nm or less and having an average variation in width of 5% or less along the entire length of each nanotrench, nanochannel or nanofin. The pattern density of the nanoscale structure array doubles the density defined by lithography.

BRIEF DESCRIPTION OF THE DRAWINGS

A more complete understanding of the present embodiments and advantages thereof may be acquired by referring to the following description taken in conjunction with the accompanying drawings, which relate to embodiments of the present disclosure. The current specification contains color drawings. Copies of these drawings may be obtained from the USPTO.

DETAILED DESCRIPTION

The present disclosure relates to self-aligned masks, methods of forming such masks, and their use to create nanoscale structures. The self-aligned masks and associated methods are compatible with any form of lithography. More specifically, a self-aligned mask is formed on a substrate during etching of a selectively etchable layer on top of the substrate by reactive ion etching (RIE). The mask may be polymerbased. For example, it may be formed from a polymer residue. The underlying substrate material may then be etched to form nanoscale structures, such as nanotrenches, nanochannels and nanofins, or an array of nanoscale structures. The feature size of the nanoscale structures can be much smaller than the feature size defined by lithography. The pattern density of the nanoscale structures doubles the density defined by lithography. The method of forming a self-aligned mask and its application to fabricate nanoscale structures greatly simplify the manufacturing process flow, resulting in significant cost reduction and yield improvement.

Figure 1A:
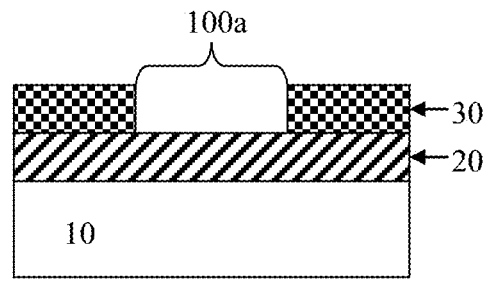
FIGS. 1A-1E show a method of using a self-aligned mask to form nanotrenches and nanochannels.
Figure 1B:
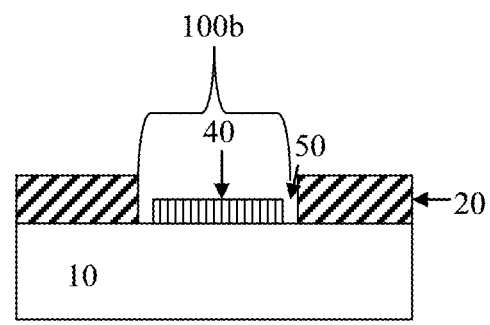

In one embodiment of the disclosure, the self-aligned mask may be formed by patterning a selectively etchable layer 20, which is located on top of a substrate 10, using lithography, as shown in FIG. 1A. The lithography can be optical lithography, e-beam lithography, imprint lithography, scanning probe lithography or any other form of lithography. The lithography defines a gap 100*a* in the resist layer 30. An RIE process is performed to etch the selectively etchable layer and transfer the gap 100*b* into the selectively etchable layer. The RIE may include any plasma enhanced etching. As shown in FIG. 1B, the RIE results in the formation of a self-aligned mask 40 on the bottom wall of the gap 100*b* with unprotected regions 50 on the bottom wall of the gap 100*b* near the junctions with the sidewalls. The polymer also forms on the sidewalls, which is not shown in FIG. 1.

The self-aligned nanolighography mask can be used to form nanoscale structures. In one embodiment, a $2^{nd}$ etching step is performed to etch the substrate material. The self-aligned mask 40 works as an etch mask in this etching step. In one embodiment, this $2^{nd}$ etching step is an anisotropic etching. This $2^{nd}$ etching step only removes the substrate material at unprotected regions 50 to form nanotrenches 60 with sidewalls 70, in FIG. 1C.

Figure 1C:
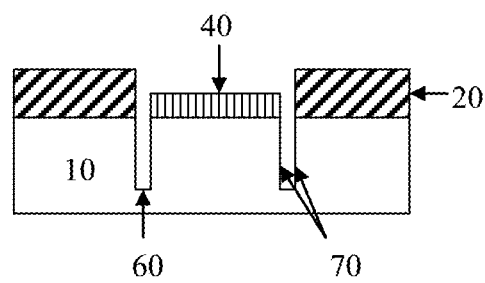
Figure 1D:
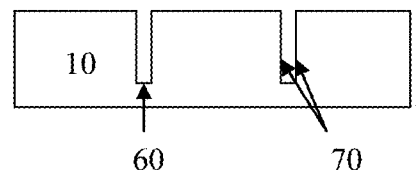

FIG. 1D shows the nanotrenches after the removal of the selectively etchable layer 20 and self-aligned mask 40. The nanotrenches formed in this process have a smaller width compared to the width of the gap 100*a* defined by lithography on the resist 30. Two nanotrenches are generated from each gap 100*a* defined by lithography. This doubles the pattern density.

Figure 2A:
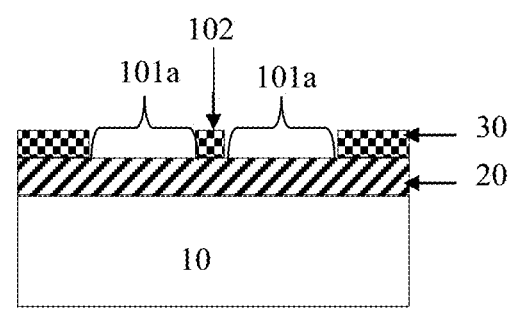
FIGS. 2A-2D show a method of using a self-aligned mask to form nanofins.
Figure 2B:
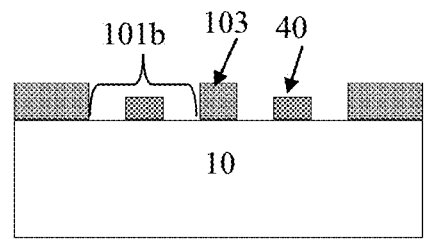
Figure 2C:
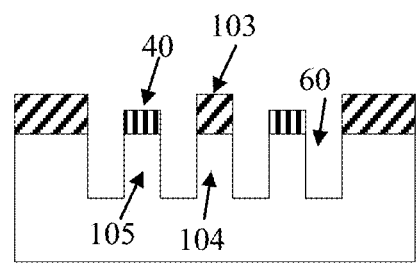

In another embodiment, nanolithography is used to define smaller gaps 101*a* and resist line 102 in between the gaps in a resist layer 30, as shown in FIG. 2A. Both the gaps 101*a* and resist lines 102 have nanoscale dimensions. The lithography may be optical lithography, e-beam lithography, imprint lithography, scanning probe lithography or any other form that has nanoscale resolution. Then an RIE processes is performed to transfer the gaps 101*b* into the selectively etchable layer 20, which results in formation of the self-aligned mask 40 on the bottom walls of gaps, as shown FIG. 2B. Then a $2^{nd}$ etching step is performed to etch the substrate 10 in the regions which are not protected by the self-aligned mask 40 and the selectively etchable layer 20. This forms nanotrenches 60 and nanofins 104 underneath the selectively etchable layer 103 produced by resist line 102, as well as nanofins 105 underneath the self-aligned mask 40, as shown in FIG. 2C. Nanofins 104 and nanofins 105 may have different widths. The pattern density of nanofins doubles that defined by lithography.

In one embodiment, the substrate 10 contains silicon. In one embodiment the substrate is single crystalline silicon. In one embodiment, the substrate is a silicon-on-insulator (SOI) substrate. In one embodiment, the silicon is a doped silicon.

In one embodiment, the selectively etchable layer 30 contains a dielectric film. In some embodiments, the dielectric film includes silicon dioxide ($SiO_2$), silicon nitride ($Si_3N_4$), silicon oxynitride ($Si_xO_yN_z$, where $0<x<3$, $0<x<2$, $0<z<4$, and where each molecule in the material may not have the same chemical formula), or a dielectric with a low dielectric constant (4 or less), such as fluorine-doped silicon glass, carbon doped silicon dioxide, porous silicon dioxide, porous carbon-doped silicon dioxide, an organic polymeric dielectric, such as a polyimide, a polynorbornene, a benzylcyclobutene, and polytetrafluoroethylene, and a silicone-based polymeric dielectric, such as hydrogen silsesquioxane and methylsilsequioxane. When an organic polymeric dielectric or a silicone-based dielectric is used, it may be deposited using a spin-on method.

In one embodiment, the selectively etchable layer 30 may contain multiple sub-layers. A hard mask layer such as Cr, Ni, TiN may be placed on top of a dielectric film. An anti-reflective coating (ARC) may be also applied on top of the selectively etchable layer to reduce the optical reflection during optical lithography process.

In one embodiment, RIE may be performed on a gap by exposing the assembly to a fluorocarbon plasma. The fluorocarbon plasma may contain a $C_xF_y$ gas, such as $CF_4$, $C_2F_6$, or $C_3F_8$, or a $C_xH_yF_z$ gas, such as $CHF_3$, or $CH_2F_2$. In specific embodiments, it may contain mixtures of these two types of gasses. In particular embodiments, it may contain $CF_4$ or $CHF_3$. The fluorocarbon plasma may also contain other gases, such as $SF_6$, $NF_3$, $H_2$, $O_2$, $CO_2$, CO, $NO_2$, Ar or He.

During RIE, very volatile reaction products are produced. For example, the reaction: $4F+SiO_2 \rightarrow SiF_4+O_2$ generates a very volatile $SiF_4$ product, which assists in etching of the dielectric film 20. Carbon is usually added to the plasma during RIE to achieve anisotropic etching and maintain the critical dimension. A high carbon (C) to fluorine (F) ratio leads to polymer formation and increased etch selectivity of silicon dioxide or other silicon-based dielectric film over silicon, due to preferential polymer formation on silicon surfaces. For example, the carbon to fluorine ratio (1/3) in a $CHF_3$ plasma is high to lead to too much polymer formation. The $CHF_3$ plasma alone will lead to a taped profile in etching of $SiO_2$. To achieve a vertical etching profile, $O_2$ can be added to remove the excessive polymer formation. A $CHF_3$ to $O_2$ ratio between 3:1 to 20:1 can produce a vertical etching profile, depending on the etching equipment. This helps ensure that the etched area corresponds to the pattern established using lithography as shown in FIG. 1A and FIG. 2A. Self-aligned mask 40 also forms.

Figure 3:
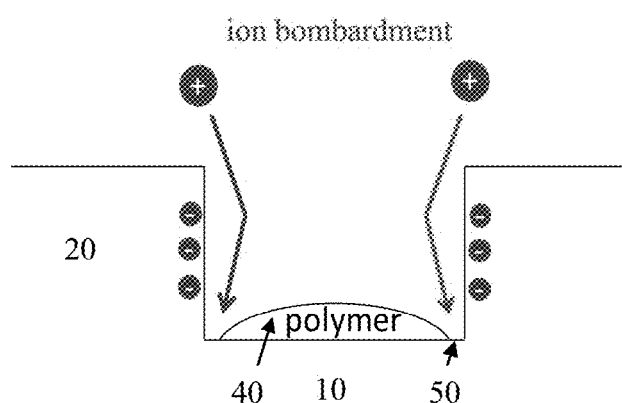
FIG. 3 shows sidewall charging affects ion movement during RIE.
Figure 4A:
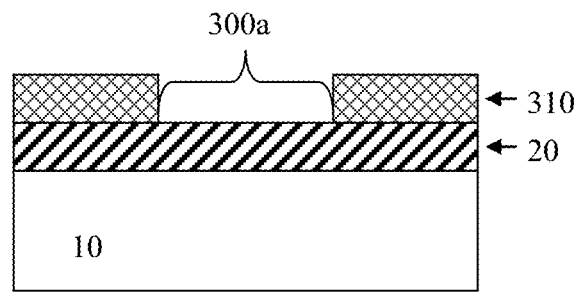
FIGS. 4A-4F show another method of using a self-aligned mask to form nanotrenches.
Figure 4B:
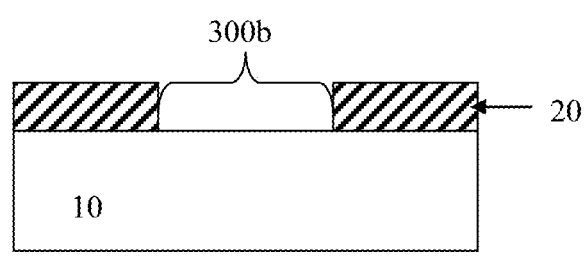
Figure 4C:
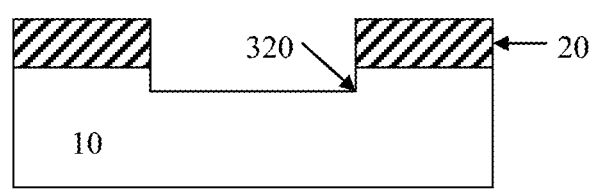
Figure 4D:
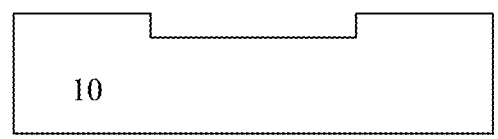
Figure 4E:
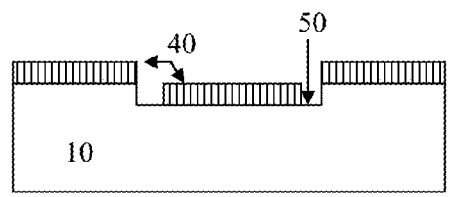
Figure 4F:
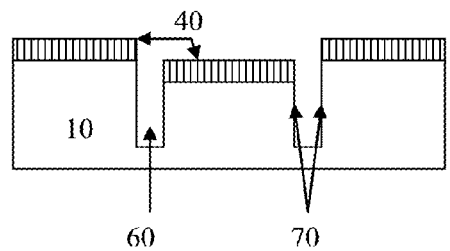

Without limiting the invention to a particular mode of action, in one embodiment, the sidewalls of the gap may be negatively charged, as shown in FIG. 3. Due to their lighter mass, electrons in the plasma used for RIE move much faster than the ions, allowing the sidewalls of the gap to become negatively charged. The electric field created by the charged sidewalls deflects ion flux in plasma and attracts more ions close to the edges of the bottom wall near the sidewalls. This leads to more ion bombardment and polymer removal near these edges.

Self-aligned mask 40 may be 1 nm to 10 nm thick. It may be about 2 nm thick for a self-aligned mask formed in a fluorocarbon plasma on a silicon surface.

The etching of substrate material in the $2^{nd}$ etching step may preferably be anisotropic to maintain a nanoscale dimension. In some embodiments, the $2^{nd}$ step etching is reactive ion etching including any plasma enhanced etching. In some embodiments, the $2^{nd}$ step etching is wet etching. In a particular embodiment, the substrate material to be etched contains (110) oriented single crystalline silicon. Silicon crystal contains different crystal planes. In some etchants, the crystal may be etched readily along certain planes, but is highly resistant to etching along the (111) plane, as defined using the Miller index. If the length direction of lithography defined gap aligns with <112> direction on a (110) wafer, the etching will expose the (111) planes perpendicular to the wafer surface.

In one embodiment, the etchant may be an anisotropic etchant, such as potassium hydroxide (KOH), sodium hydroxide (NaOH), tetramethylammonium hydroxide (TMAH), or ethylene diamine and pyrocatechol solution (EDP). The etchant may also contain additives to stabilize the etchant or to better control the etching process. Etching may be carried out at any temperature suitable for etching with the selected etchant, such as from 40° C. to 100° C. Etching may be carried out at a lower temperature when shallower nanotrenches or nano channels are desired or careful depth control is needed.

As shown in FIG. 1C and FIG. 2C, the silicon-based substrate 10 may be etched using any wet anisotropic etching process that removes the silicon or silicon-containing materials in the area of unprotected regions 50 to form nanotrenches 60, while not removing silicon-based substrate 10 under self-aligned mask 40 or selectively etchable layer 20. Nanotrench sidewalls 70 may be defined by the (111) plane of silicon crystal. These walls may be smooth due to the etching-resistance of the (111) plane.

In the embodiment shown, nanotrenches 60 have rectangular cross-sections and sidewalls 70 are generally perpendicular to the top of nanotrenches 60. Sidewalls 70 may be defined by the silicon crystal (111) plane. Both nanotrenches and nanofins have rectangular profile and nearly atomically smooth sidewalls. These are highly desirable properties for many applications.

The size of nanotrenches 60 is not determined by the size of the pattern defined during assembly of the pattern as shown in FIG. 1A and FIG. 2A. This allows the process to be compatible with any lithographic technique. However, regardless of lithographic technique, the width of nanotrenches 60 may be of a nanometer scale. For example, it may be 200 nm or less, 100 nm or less, 50 nm or less, 40 nm or less, 30 nm or less, or even 20 nm or less. In general, the width may be controlled by adjusting RIE power, with higher power resulting in more ion bombardment, depleting more polymer along the edges of the gap 100b or 101b and resulting in wider depressions. A taller sidewall, for example resulting from a thicker selectively etchable layer 20, may also affect ion sputter and thus the width of nanotrenches, nanochannels or nanofins. Nanofins may also have a width on a nanometer scale.

Nanotrenches with uniform width along the trench may be useful in many applications. The variation in width along a nanotrench may be 5% or less, 3% or less, or even 2% or less. Similarly, the variation in width among each of an array of nanotrenches may be 5% or less, 3% or less, or even 2% or less.

The depth of nanotrenches 60 may be controlled by the etch time. Nanotrench depth may also be controlled by using a silicon-on-insulator wafer. The anisotropic wet etching of silicon stops at the buried insulator (silicon oxide) layer. The thickness of the silicon thin film on top of the buried insulator determines the depth of the nanotrenches. It may vary between 5 nm to 10 μm.

Nanoscale structures may have a high aspect ratio (height:width). For example it may be 5 or higher, 10 or higher, 20 or higher, 40 or higher.

The length of nanotrenches may be controlled by the size of silicon-based substrate 10 and the lithography pattern. Nanotrenches may be 100 nm or longer, 1 μm or longer, 10 μm or longer, 100 μm or longer, 1 mm or longer, or 10 mm or longer. Additionally, the length:width ratio may be 2 or more, 10 or more, 100 or more, 1000 or more, 10,000 or more, 100,000 or more, or 1,000,000 or more.

Figure 2D:
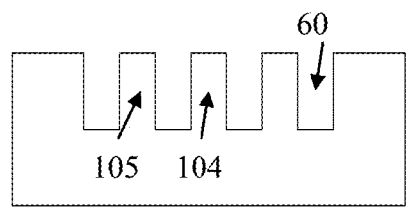

After etching, any remaining silicon-based film 20 or other layer may be removed from silicon-based substrate 10 as shown in FIG. 1D and FIG. 2D. Self-aligned mask 40 may be removed, for example by using a Piranha solution (a mixture of sulfuric acid $H_2SO_4$ and hydrogen peroxide $H_2O_2$). It may also be removed by $O_2$, $H_2$ or $CF_4$ plasma at an elevated temperature such as 200° C. or higher.

Forming Nanochannels

Figure 1E:
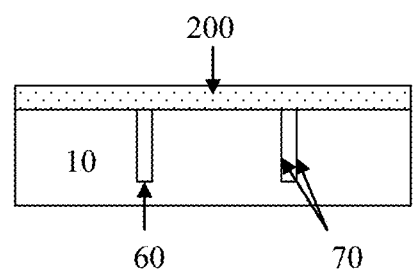

Optionally, as shown in FIG. 1E, the open tops of nanotrenches 60 may be covered, for example by cover layer 200. In the embodiment as shown, this results in the formation of nanochannels from the covered nanotrenches. Cover layer 200 may be formed by bonding another substrate, such as a silicon wafer or glass to silicon-based substrate 10. Cover layer 200 may also be formed by conformably depositing a thin film on silicon-based substrate 10. For example a silicon dioxide film may be deposited by plasma-enhanced chemical vapor deposition (PECVD) or laser melting. Cover layer 200 may further be formed by imprinting nanotrenches 60 into a polymer layer leaving unfilled channels.

Other than having a cover, nanochannels may have the same properties as nanotrenches described herein. Except in embodiments where the top of a nanotrench must remain open, all description of nanotrenches herein is equally applicable to nanochannels.

Forming Silicon Nanotrenches with Low Resolution Lithography and Anisotropic Wet Etching To fabricate silicon nanotrenches in (110) silicon with wet anisotropic etching, the pattern edge of the gap defined by lithography should be smooth. Some low resolution (in micron scale) lithography, such as g-line optical lithography, generates rough edges. In this case, an alternative embodiment can be used to produce nanotrenches, shown in FIG. 4.

In one embodiment, the method illustrated in FIG. 4 may be used to produce silicon nanotrenches. A selectively etchable layer 20, for example a dielectric silicon-based film, such as silicon dioxide, is deposited on a (110) silicon substrate as shown in FIG. 4A. A photoresist 310 is applied on top of selectively etchable layer 20 and patterned optically to create gap 300a. The pattern may be aligned in the <112> direction of the silicon crystals in silicon substrate 10. The pattern may be transferred through the selectively etchable layer 20 to form gap 300b and photoresist 310 may be removed as shown in FIG. 4B. The line edge roughness (LER) of low resolution optical lithography is normally well above 100 nm, therefore, the sidewalls of photoresist 310 as shown in FIG. 4A and selectively etchable layer 20 as shown in FIG. 4B are normally rough. Before forming a self-aligned mask 40, an anisotropic etching agent of the type described herein, such as TMAH, in the etching section below is applied to form a gap, in silicon substrate 10 having smooth sidewalls 320. (FIG. 4C.) The smooth sidewalls 310 are exposed on the (111) plane and are therefore etched much slower than other planes. Next, the selectively etchable layer 20 is removed as shown in FIG. 4D. For example, it may be removed using hydrogen fluoride (HF). An optional thermal oxide growth step may be conducted prior to RIE in this embodiment to assist in the formation of a more uniform self-aligned mask 40 during RIE. Then a RIE (or plasma treatment if no optional oxide growth step was applied) is performed using a fluorocarbon plasma to form the self-aligned mask 40 on the silicon surface with unprotected region 50, as shown in FIG. 4E. A further anisotropic wet etching with etchant described above, such as TMAH, generates nanotrenches 60 with smooth sidewalls 70, as shown in FIG. 4F.

Additional Nanotrench Treatments

If desirable, thermal oxidation may be employed to render nanotrenches 60 hydrophilic or to further decrease their width. In another embodiment, sidewalls 70 and other portions of nanotrenches 60 may be functionalized.

Contact Pads Connected to Nanotrenches

Figure 5:
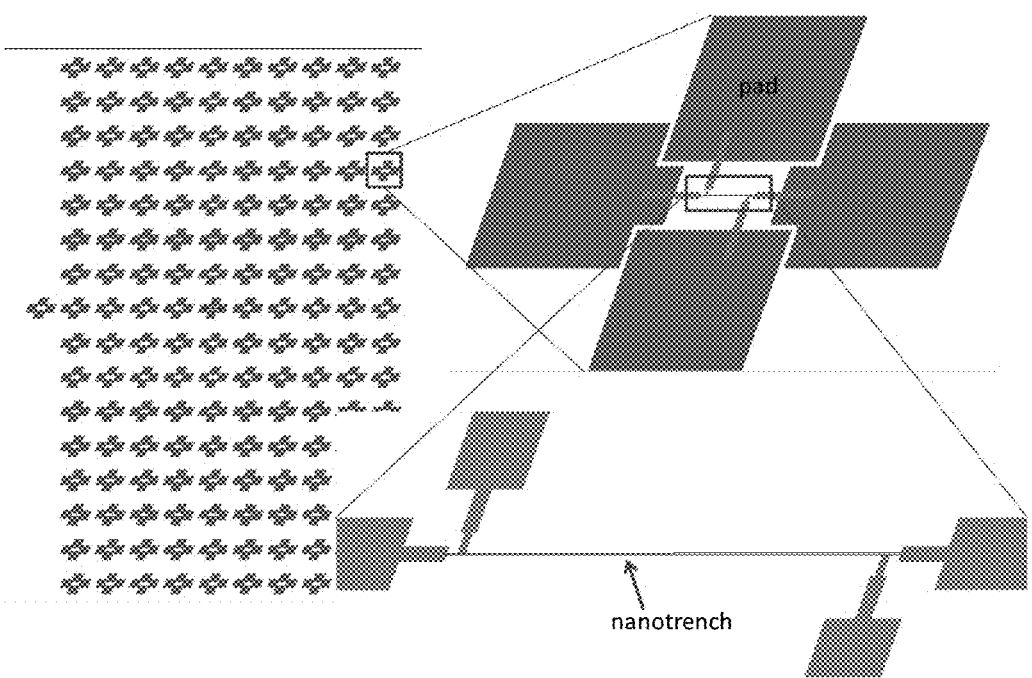
FIG. 5 shows a pattern for nanotrenches connected to contact pads.

In one embodiment, a silicon-based object containing nanotrenches and other functional features may be formed using the techniques described herein. For example, by including an additional lithography-step or a particular lithography pattern, contact pads may be positioned at one or both ends of the nanotrench or along the nanotrench, as illustrated in FIG. 5.

Silicon-Based Objects Containing Nanotrenches

Silicon-based objects containing nanotrenches may have a variety of applications, but they may be particularly useful in nanofluidics.

Figure 6:
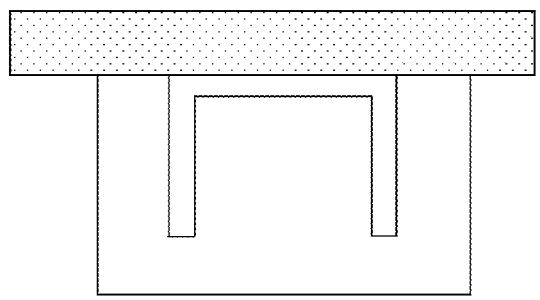
FIG. 6 shows a two vertical nanochannels connected by a planar nanochannel.

Process and pattern design may be optimized to increase trench density in the substrate and improve transport volume. The process of the present disclosure already improves trench density because two trenches are formed for every lithographic line. Additionally by controlling the height difference between different blocks of substrate between the trenches, for example as described in Example 3, additional fluid volume may be transported through additional trenches formed by the lower-height substrate. FIG. 6 presents an example of a nanochannel array, which contains two vertical, high-aspect-ratio nanochannels, connected by planar channels. This increases the effective cross-sectional area of the nanochannels which can sustain more pressure and, thus, higher throughput when used in a nanofluidic device.

In more specific embodiments, the silicon-based objects may be useful in applications where chemicals or biological materials are passed through the nanotrenches. Such applications may include analysis, separation and drug delivery. The nanotrenches are particularly well-suited for use with chemical and biological molecules because their width is close to both the Debye length and size parameters of biological molecules.

In a particular embodiment, nanotrenches formed in (110) silicon etched by anisotropic wet etching, according to the present disclosure may also be particularly well-suited for use with chemical and biological molecules because they may have atomically smooth sidewalls, which confer uniform surface properties. This lowers the friction of the sidewalls and the adsorption of molecules. It also reduces the chances of clogging.

Nanotrenches formed according to the present disclosure may also be particularly well-suited for use with chemical and biological molecules because the sidewalls can be chemically treated or modified using reactive chemicals or reactive ion etching to yield specific chemical properties, such as making the surface hydrophilic or hydrophobic, or providing specific chemical activity to bond certain chemicals. Some chemical properties may lower the friction of the sidewalls and the adsorption of molecules. They may also reduce the chances of clogging.

Nanotrenches may be particularly useful in silicon-based objects designed to contain DNA, for example, DNA sequencing devices, sensors, or other testing devices. However, nanotrenches fabricated by conventional methods are often not as long as many DNA molecules, which are nanometer scale in width, but centimeter scale in length. This occurs because the length of nanotrenches defined by direct writing of nanoscale lithography tools is limited by the writing field of these tools. For example, the writing field of a typical e-beam lithography tool is about 100 µm, making it challenging to fabricate a nanotrench longer than 100 µm in length using such a tool. Methods of the present disclosure overcome this writing field limitation.

Figure 7:
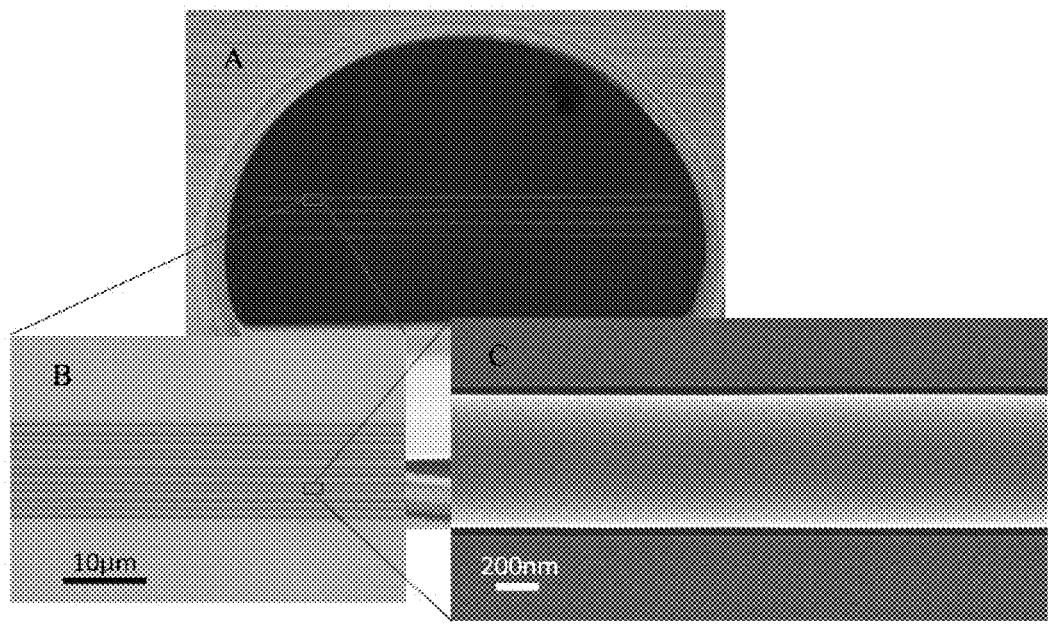
FIG. 7 shows a photographic image (A), an optical microscope image (B), and an scanning electron microscope image (SEM) (C) of a 9-cm long nanotrench array.

Nanotrenches and nanochannels of the present disclosure may be sufficiently long to accommodate long biological molecules, such as DNA or other lengthy nucleic acids. This may be especially helpful in stretching and stabilizing DNA molecules for sequencing. FIG. 7 illustrates example nanotrenches that are sufficiently long to accommodate biological molecules. FIG. 7A shows a photograph of an array of nanotrenches that are 9 cm long, formed in a 4 inch silicon wafer. FIG. 7B shows an optical microscope image of such an array, while FIG. 7C presents an SEM image.

For drug delivery applications in which different drugs need to be released at different times, different nanotrenches or, more likely, nanochannels, may simply be etched into the substrate by etching for different times. The ability to achieve trenches with high aspect ratios further allows a wider range of release rates as compared to conventionally etched silicon. The smoothness of the nanotrench side walls may reduce viscous loss in some uses of the completed silicon-based object, such as in implantable devices.

Nanotrenches according to the present disclosure may also be particularly helpful in the manipulation or screening of nanoparticles.

Silicon-Based Objects Containing Nanofins

Silicon-based objects containing nanofins may have a variety of applications, but they may be particularly useful in a field effect transistor (FET). In such a transistor, a nanofin or an array of nanofins can be connected to two electrodes, called the source and the drain. Another electrode called the gate can wrap around the nanofin or nanofin array. A dielectric material may be inserted between the gate and the nanofin or nanofin array. Such a structure is called a FinFET and is the building block of advanced integrated circuits. Compared to planar transistors, FinFETs increase device performance with reduced power consumption. Nanofins formed according to methods of the present disclosure double the fin density defined by lithography. These densified nanofins can handle a larger drive electric current, resulting in better device performance. In addition, methods of the present disclosure may be used to produce nanofins at doubled density with a more simple process than conventional methods, resulting in reduced manufacturing cost.

Nanofins of the present disclosure may be particularly useful in FET sensor applications. The surfaces of a nanofin or nanofin array connecting the source and drain electrode can be functionalized with receptor molecules. These receptors may allow the attachment of biological or chemical ligands, which may change the conductance of the nanofins. This change in conductance may then be detected. Sensors of this type may detect both covalent and non-covalent receptor-ligand binding. Particularly if used with low concentrations of ligands, these sensors may detect patterns as ligands bind and become unbound from sensors, which may allow identification of a ligand through stochastic sensing. Alternatively, receptors may be specific for a particular ligand, such that the mere act of binding identifies the ligand. FET sensors containing nanofins of the present disclosure may be particularly well-suited for detecting rapid changes in conductance caused by on/off ligand reactions.

When nanofins are formed from (110) silicon by anisotropic wet etching, the (111) sidewall surfaces of the nanofins are particularly well suited for functionalization due to higher surface states of the (111) plane as compared to other crystalline places.

Sensors may also benefit from both the high aspect ratio for nanofins and increased nanofin density as compared to that obtainable with current methods.

Nanofins with a high aspect ratio may be particularly useful in increasing drive current for FinFET and sensitivity in FinFET sensors.

In many of the above embodiments, nanoscale structures may be formed as an array, rather than as individual structures.

EXAMPLES

The following examples provide further details regarding certain aspects of the disclosure and are not intended to describe the complete invention. In all of the examples, the resulting silicon substrate containing nanotrenches or nanochannels had large defect-free areas.

Example 1

Figure 8:
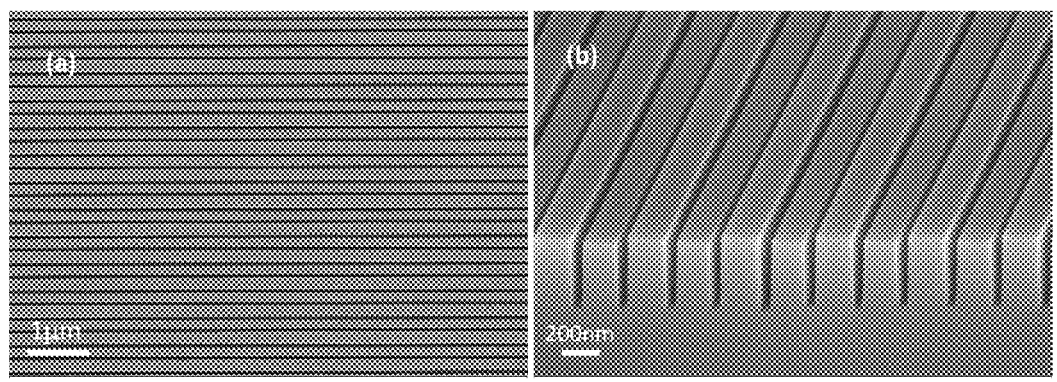
FIG. 8 shows an SEM image of nanotrenches formed using methods of FIGS. 1A-1E.

FIG. 8 presents a scanning electron microscope (SEM) image of nanotrenches obtained in a (110) silicon substrate. The nanotrench pattern width was initially defined by e-beam lithography to be 200 nm with a 450 nm pitch. Nanotrenches were approximately 60 nm wide. FIG. 8 demonstrates that anisotropic etching produced vertical nanotrenches in the silicon substrate with uniform width and nearly atomically smooth sidewalls.

Figure 9:
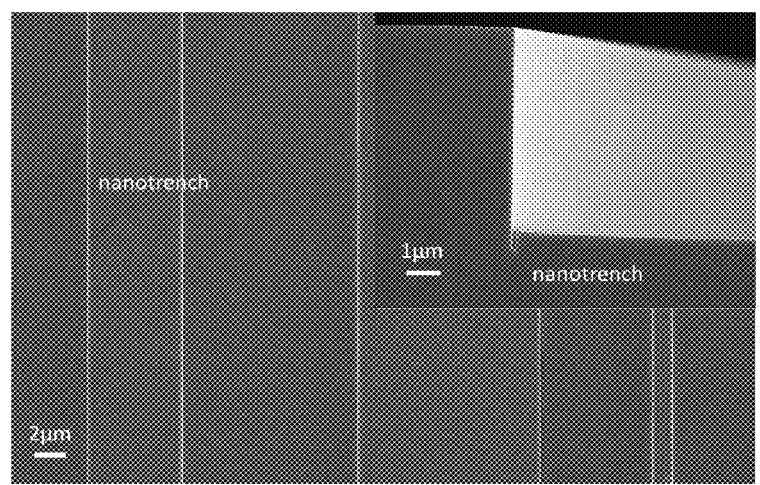
FIG. 9 shows nanotrenches formed using methods of FIGS. 4A-4F.

FIG. 9 presents an SEM image of nanotrenches obtained using low resolution optical lithography, following the method shown in FIG. 4.

Figure 10:
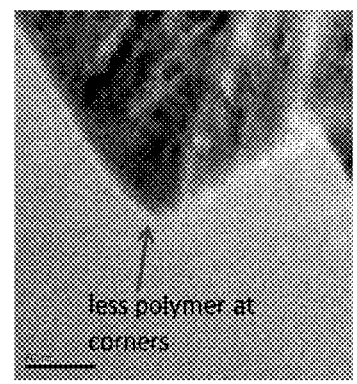
FIG. 10 shows a TEM image of a self-aligned mask and unprotected areas after RIE.

FIG. 10 presents a TEM image showing a self-aligned mask in a silicon dioxide layer after RIE. The unprotected region where the bottom wall of the gap meets the sidewall can be seen.

Example 2

Figure 11A:
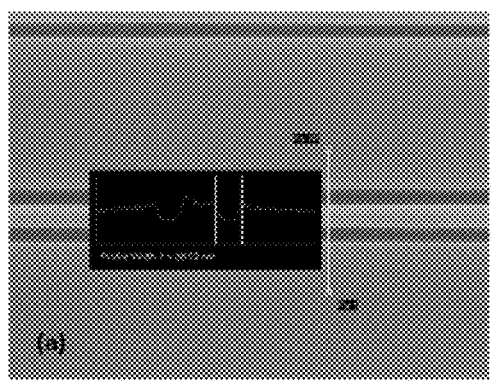
FIG. 11A shows an SEM image of nanotrenches that are 35 nm wide.
Figure 11B:
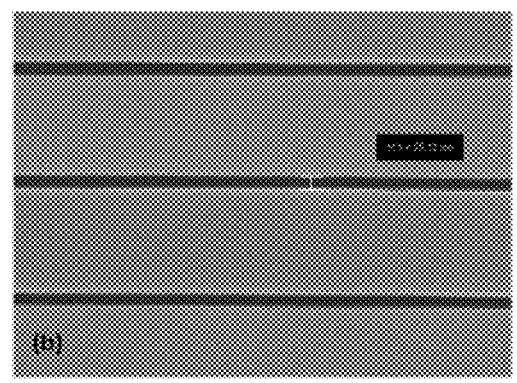
FIG. 11B shows an SEM image of nanotrenches that are 25 nm wide.

By controlling the thickness of a silicon oxide film, and RIE conditions such as gas pressure, flow rates, power, and etching time silicon nanotrenches were produced as shown in FIG. 11, with widths of 35 nm (FIG. 11A) and 25 nm (FIG. 11B). Further control of these parameters may be used to produce nanotrenches 20 nm or less in width.

Example 3

Figure 12A:
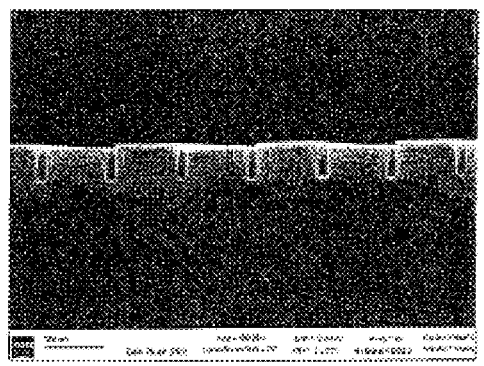
FIGS. 12A and 12B each show an SEM image of a cross-section of nanotrenches with indented silicon block structure.
Figure 12B:
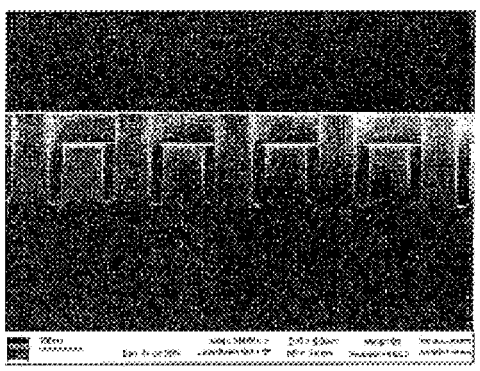

A silicon substrate with variations in the height of the silicon between nanotrenches as shown in FIG. 12 was produced by controlling the RIE conditions. FIG. 12A shows an SEM image of silicon nanotrenches in which the silicon between trenches varies by 10 nm in height. This difference was obtained with 1 minute RIE. FIG. 12B shows an SEM image of silicon nanotrenches in which the silicon between trenches varies by 160 nm in height after 10 minute RIE. This ability to control silicon height allows the single-lithography step fabrication of 3-D nanostructures.

Example 4

Figure 13A:
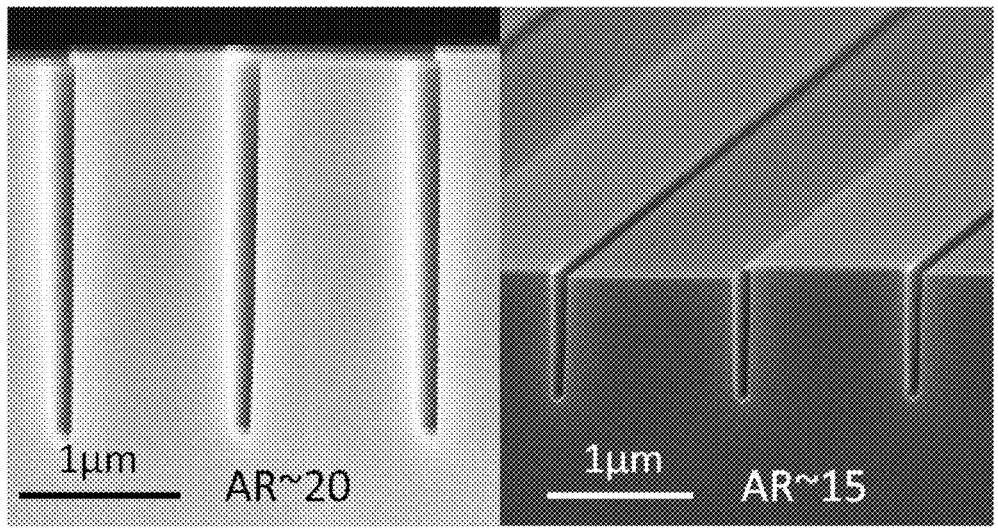
FIG. 13A shows an SEM image of nanotrenches with an aspect ratio of 20 and 15.

For many applications, including biomolecule separation, nanotrenches with a high aspect ratio may be useful for increasing fluid flow rate and thus efficiency. The etching selectivity between the (110) and (111) planes, particularly with potassium hydroxide is such that very deep nanotrenches may be obtained. As shown in FIG. 13A, nanotrenches with aspect ratios of 15 and 20 were successfully generated.

Figure 13B:
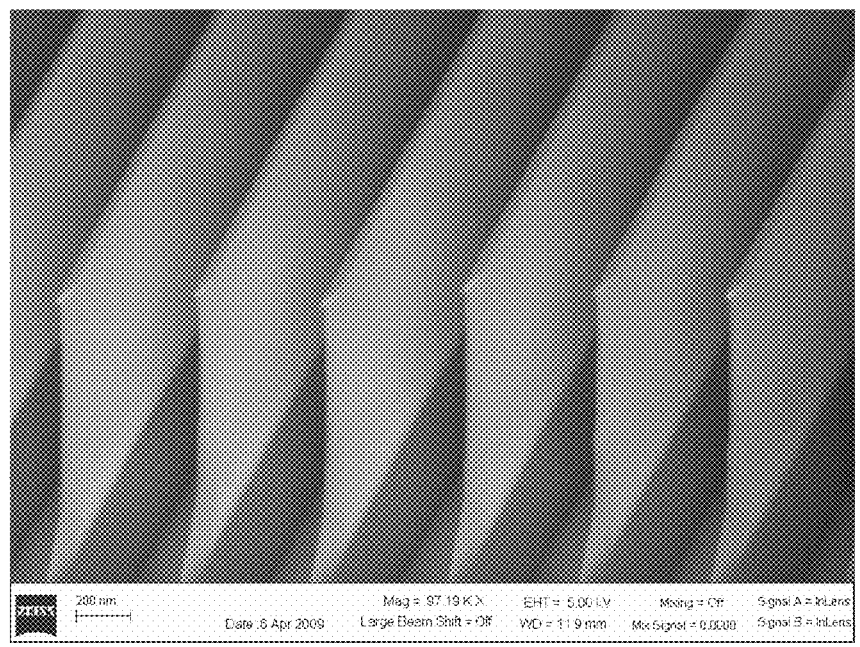
FIG. 13B shows and SEM image of nanofins with an aspect ratio of 40.

Nanofins with a high aspect ratio of 40 are shown in FIG. 13B.

Example 5

Figure 14:
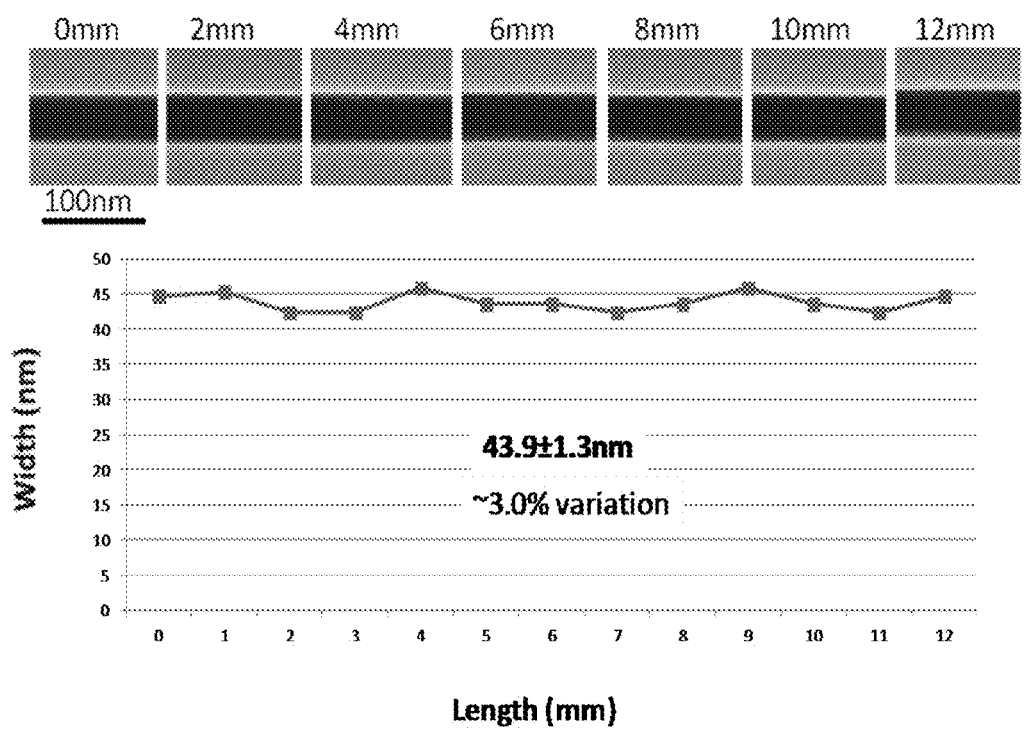
FIG. 14 shows the width along a single nanotrench.
Figure 15:
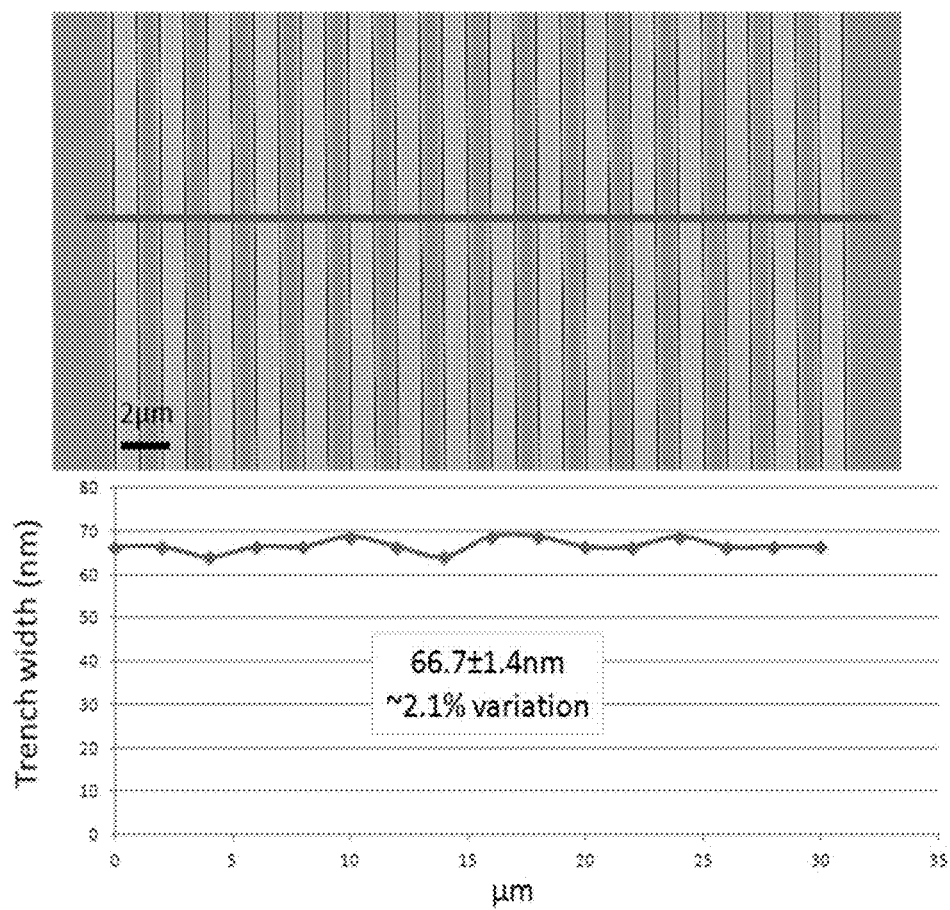
FIG. 15 shoes the width along an array of nanotrenches.

The variation in width along a nanotrench was measured. Results are presented in FIG. 14. The variation in width along a nanotrench was found to be about 3%. The variation in width along an array of nanotrenches was measured. Results are presented in FIG. 15. The variation in width along an array of nanotrenches was found to be about 2.1%.

Example 6

Figure 16:
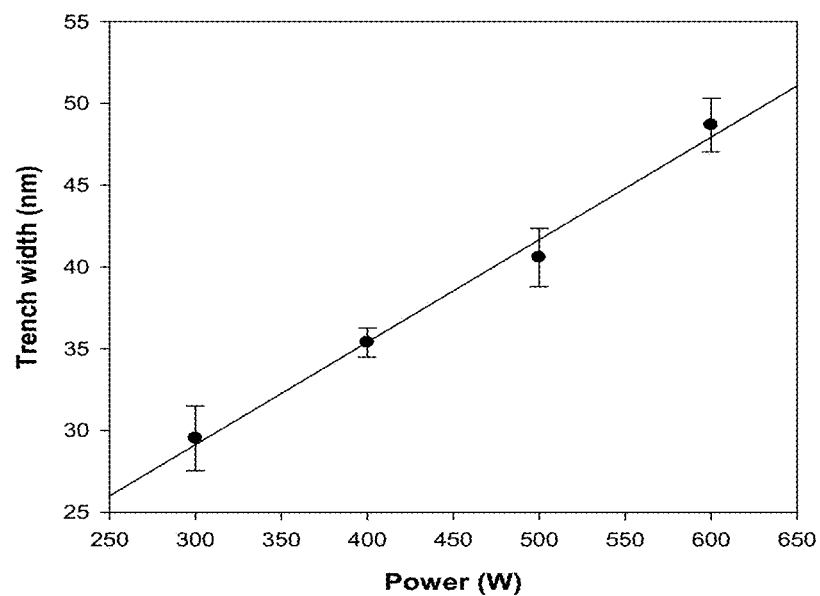
FIG. 16 plots RIE power versus nanotrench width.

Four samples from the same silicon wafer were prepared using the same process, including a single e-beam writing step, except that RIE power was varied and was either 300 W, 400 W, 500 W or 600 W. The width of the nanotrenches formed was plotted against RIE power and a linear correlation was seen. (FIG. 16.)

Example 7

Figure 17:
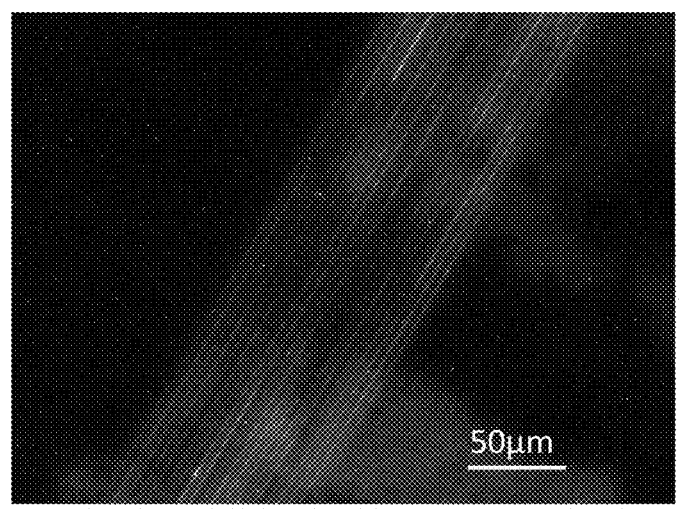
FIG. 17 presents a fluorescence microscopy image of nanotrenches filled with fluorescent solution.

To show the ability to distribute fluorescent materials in nanochannels formed as described above, a fluid of 0.5 mM biotin-4-fluorescein, 50 nM Tris-hydrochloric acid (HCl) (pH 7.5) and 5 mM Ethylenediaminetetraacetic acid (EDTA) was added to an array of 20 nanotrenches that were 60 nm wide and spaced 5 μm apart from one another. Results are presented in FIG. 17. These results demonstrate that the nanotrenches are flow-through trenches.

Although only exemplary embodiments of the invention are specifically described above, it will be appreciated that modifications and variations of these examples are possible without departing from the spirit and intended scope of the invention. For instance, numeric values expressed herein will be understood to include minor variations and thus embodiments "about" or "approximately" the expressed numeric value unless context, such as reporting as experimental data, makes clear that the number is intended to be a precise amount. The terms height and depth may be used interchangeably herein.

The invention claimed is:

1. A method for forming a nanoscale structure comprising:
    forming a self-aligned mask comprising:
        forming a pattern on a selectively etchable layer located on top of a substrate using lithography,
    performing reactive ion etching (RIE) with plasma on the selectively etchable layer to transfer the pattern to the selectively etchable layer, wherein RIE results in the formation of at least one gap corresponding to the pattern and in the formation of a self-aligned mask on the bottom wall of the gap with unprotected regions on the bottom wall of the gap near the junctions with sidewalls of the gap, wherein a pattern density formed by the RIE doubles a pattern density formed by the lithography; and
    etching the unprotected regions on the bottom wall of the gap to remove the substrate material under the unprotected regions to form a nanoscale structure, wherein the nanoscale structure is a nanotrench, nanochannel, or nanofin.

2. The method of claim 1, wherein the substrate contains silicon.

3. The method of claim 2, wherein the substrate comprises (110) orientated single crystal silicon.

4. The method of claim 3, wherein etching comprises anisotropic wet etching with an etchant having an etching rate normal to the (111) crystalline plane of the single crystal silicon that is lower than the rate normal to other planes.

5. The method of claim 1, wherein the selectively etchable layer comprises a dielectric film.

6. The method of claim 1, further comprising covering the nanotrench to form the nanochannel.

7. The method of claim 1, wherein the nanotrench has a width of 100 nm or less.

8. The method of claim 1, wherein the nanotrench has an average variation in width of 5% or less along its entire length.

9. The method of claim 1, wherein the nanotrench has an aspect ratio of as high as 20.

10. The method of claim 1, wherein the nanotrench has a length of between 100 nm and 9 cm.

11. The method of claim 1, further comprising forming an array of nanoscale structures.

12. The method of claim 11, wherein the pattern density of the array of nanoscale structures doubles that defined by lithography.

13. The method of claim 11, wherein the array of nanoscale structures comprises at least two nanoscale structures having different heights or depths.

14. The method of claim 1, further comprising using lithography for forming at least one contact pad adjacent to the nanoscale structure.

15. The method of claim 1, further comprising functionalizing walls of the nanoscale structure.

16. The method of claim 1, further comprising thermally oxidizing walls of the nanoscale structure.

17. A nanoscale structure array comprising a plurality of nanoscale structures having a width of 100 nm or less and an average variation in width of 5% or less along the entire length of each nanoscale structure.

18. The nanoscale structure array of claim 17, wherein walls of the nanoscale structures have been functionalized.

* * * * *